US009508337B2

(12) United States Patent
Massini et al.

(10) Patent No.: US 9,508,337 B2
(45) Date of Patent: Nov. 29, 2016

(54) LOW-NOISE FUME EXTRACTOR HOOD

(71) Applicants: Pietro Massini, Ancona (IT); Massimiliano Caimmi, Morro D'Alba (IT); Francesco Violi, Sant'Ilario D'Enza (IT); Marco Vizzaccaro, Tivoli (IT)

(72) Inventors: Pietro Massini, Ancona (IT); Massimiliano Caimmi, Morro D'Alba (IT); Francesco Violi, Sant'Ilario D'Enza (IT); Marco Vizzaccaro, Tivoli (IT)

(73) Assignee: ASK INDUSTRIES SOCIETA PER AZIONI, Monte San Vito (AN) (IT)

( * ) Notice: Subject to any disclaimer, the term of this patent is extended or adjusted under 35 U.S.C. 154(b) by 847 days.

(21) Appl. No.: 13/896,846

(22) Filed: May 17, 2013

(65) Prior Publication Data

US 2014/0341712 A1 Nov. 20, 2014

(51) Int. Cl.

| | |
|---|---|
| ***G10K 11/16*** | (2006.01) |
| ***H03B 29/00*** | (2006.01) |
| ***H04R 3/02*** | (2006.01) |
| ***G10K 11/178*** | (2006.01) |
| ***F01N 1/06*** | (2006.01) |
| ***G10K 11/34*** | (2006.01) |
| *G10K 11/175* | (2006.01) |
| *F01N 1/24* | (2006.01) |
| *G10K 11/162* | (2006.01) |

(52) U.S. Cl.

CPC ........... *G10K 11/1786* (2013.01); *F01N 1/065* (2013.01); *G10K 11/34* (2013.01); *F01N 1/24* (2013.01); *G10K 11/162* (2013.01); *G10K 11/175* (2013.01); *G10K 11/1788* (2013.01); *G10K 2210/3046* (2013.01)

(58) Field of Classification Search

CPC ............. G10K 11/175; G10K 11/178; G10K 11/1782; G10K 11/1784; G10K 11/1786; G10K 11/1788; G10K 2210/3045; G10K 2210/3046; G10K 2210/12822

USPC ...... 381/71.1, 71.3, 71.5, 71.7, 73.1, 87, 89, 381/386; 181/206, 224; 415/119

See application file for complete search history.

(56) References Cited

U.S. PATENT DOCUMENTS 4,665,549 A * 5/1987 Eriksson ............ G10K 11/1788 181/222
5,097,923 A * 3/1992 Ziegler .................. F01N 1/065 181/206

(Continued)

FOREIGN PATENT DOCUMENTS

EP 0596846 A1 5/1994
EP 0671720 A2 9/1995

(Continued)

*Primary Examiner* — Xu Mei

(74) *Attorney, Agent, or Firm* — Egbert Law Offices, PLLC

(57) ABSTRACT

A fume extractor hood is disclosed, comprising a box with a motor-fan assembly and a muffler module comprising a bearing frame defining an air extraction conduit with axis (A), an active noise suppression system comprising at least one electro-acoustic transducer and at least two microphones, a passive noise suppression system comprising a sound absorbent material. Said muffler module comprises at least two electro-acoustic transducers connected to the walls of said bearing frame, in opposite positions, in such manner to leave the central part of said conduit free. The sound beams coming from said at least two electro-acoustic transducers are mutually combined, obtaining a resulting sound beam that can be directed towards a preferred direction by means of beam forming algorithms.

12 Claims, 7 Drawing Sheets

(56) References Cited

U.S. PATENT DOCUMENTS

| | | | | | |
|---|---|---|---|---|---|
| 5,336,856 | A * | 8/1994 | Krider | F01N 1/065 | 181/206 |
| 5,457,749 | A * | 10/1995 | Cain | F01N 1/065 | 381/71.5 |
| 5,693,918 | A * | 12/1997 | Bremigan | F01N 1/065 | 181/206 |
| 5,699,437 | A * | 12/1997 | Finn | G10K 11/1788 | 381/71.12 |
| 5,828,759 | A * | 10/1998 | Everingham | G10K 11/1788 | 181/206 |
| 7,248,704 | B2 * | 7/2007 | Carme | G10K 11/1788 | 381/71.5 |
| 8,365,861 | B2 * | 2/2013 | Massini | G10K 11/1784 | 181/206 |
| 2004/0194776 | A1 | 10/2004 | Amir | | |

FOREIGN PATENT DOCUMENTS

| | | | |
|---|---|---|---|
| EP | 0961087 | A2 | 12/1999 |
| WO | 2010094718 | A1 | 8/2010 |

* cited by examiner

LOW-NOISE FUME EXTRACTOR HOOD

CROSS-REFERENCE TO RELATED APPLICATIONS

Not applicable.

STATEMENT REGARDING FEDERALLY SPONSORED RESEARCH OR DEVELOPMENT

Not applicable.

NAMES OF THE PARTIES TO A JOINT RESEARCH AGREEMENT

Not applicable.

INCORPORATION-BY-REFERENCE OF MATERIALS SUBMITTED ON A COMPACT DISC

Not applicable.

BACKGROUND OF THE INVENTION

1. Field of the Invention

The present patent application for industrial invention relates to a low-noise fume extractor hood.

Although specific reference will be made hereinafter to an extractor hood for kitchen, the invention is also extended to an industrial extractor hood.

2. Description of Related Art Including Information Disclosed Under 37 CFR 1.97 and 37 CFR 1.98.

As it is known, an extractor hood comprises a fan disposed in an extractor conduit provided with inlet filter. The fan is driven into rotation by an electric motor in order to extract fumes through the extraction conduit.

Said types of hoods are impaired by the very high noise level, both for the noise generated by motor, fan, and other mechanical moving parts, for the noise generated by the turbulent vertical air flow that is extracted in the conduit of the hood, and for the noise of the air passing through the inlet filter.

In order to solve such a drawback, at least partially, solutions provided with active noise suppression system are known.

Patent application EP 0 596 846 discloses a kitchen extractor hood provided with active noise suppression system. The hood is provided with microphones to detect noise, a loudspeaker generating a sound adapted to suppress noise and a control unit that controls the loudspeaker according to the noise detected by the microphones. The single loudspeaker is disposed with axis of emission substantially horizontal to the axis of conduit of hood, which is substantially vertical.

Patent applications US 2004/194776 and WO2010094718 disclose a hood with noise suppression system that provides for a loudspeaker disposed in central position inside the conduit of the hood. Said position of the loudspeaker results in a series of drawbacks, because of turbulence of the air flow extracted in the conduit of the hood that meets with the central support of the loudspeaker. Consequently, it is necessary to increase the power of motor, so that the flow of extracted air passes beyond the obstacle represented by the loudspeaker. Moreover, the loudspeaker in central position tends to get dirty because of direct contact with fumes extracted by the hood.

In any case, the known active noise suppression systems provide for one loudspeaker only, and do not allow for directivity of the sound signal beam, unless very expensive loudspeakers are used. Instead, according to the position of the hood, it is especially important to direct the sound beam of loudspeakers in a preferential direction with higher noise.

EP 0 671 720 discloses a hood with noise suppression system that can comprise one or more loudspeakers. However, EP 0 671720 illustrates only one loudspeaker with emission surface parallel to axis of conduit of hood.

WO01/6359 discloses a generic active noise reduction system not applied to an air extraction conduit. WO01/6359 teaches that loudspeakers must be generally disposed on a plane, but such a condition is not essential. WO01/6359 contains no teachings about how to dispose loudspeakers in case of air extraction conduit.

EP 0 961 087 discloses a fan provided with active noise suppression system.

Moreover, active noise suppression systems take into account only the noise generated by air extraction and do not consider the noise generated by vibration of walls of conduit housing fan and motor of hood.

The purpose of the present invention is to eliminate the drawbacks of the prior art by devising a low-noise fume extractor hood provided with active noise suppression system that does not obstruct the air extraction flow and at the same time allows for directivity of sound beam.

Another purpose of the present invention is to provide a low-noise extractor hood that is able to suppress also the vibration noise of the parts of the hood conduit.

BRIEF SUMMARY OF THE INVENTION

These purposes are achieved according to the invention, with characteristics claimed in independent claim 1.

Advantageous embodiments appear from the dependent claims.

The fume extractor hood of the invention comprises: a box containing a motor-fan assembly comprising a motor that actuates at least one-fan; and a muffler module disposed under said box of motor-fan assembly.

The muffler module comprises: a bearing frame defining an air extractor conduit with axis; an active noise suppression system comprising at least one electroacoustic transducer and two microphones connected to a control unit; and a passive noise suppression system comprising sound absorbent material disposed between said microphones.

Said muffler module comprises at least two electroacoustic transducers connected to the walls of said bearing frame, in opposite positions with respect the axis of conduit, in such manner to leave the central part of said conduit free.

Each electro-acoustic transducer has a sound emission surface inclined by an angle higher than 0° with respect to the axis of conduit to generate a sound beam with axis inclined by an angle lower than 90° with respect to axis of conduit.

In such a way, the sound beams coming from said at least two electroacoustic transducers can be combined to obtain a resulting sound beam that can be directed in a preferred direction by means of beam forming algorithms.

Advantageously, the sound emission surface of the loudspeaker is inclined with respect to the axis of conduit by an angle comprised in the range from 40° to 65°.

BRIEF DESCRIPTION OF THE SEVERAL VIEWS OF THE DRAWINGS

Additional characteristics of the invention will become clearer from the detailed description below, which refers to merely illustrative, not limiting, embodiments, illustrated in the attached drawings, wherein.

DETAILED DESCRIPTION OF THE INVENTION

Figure 1:
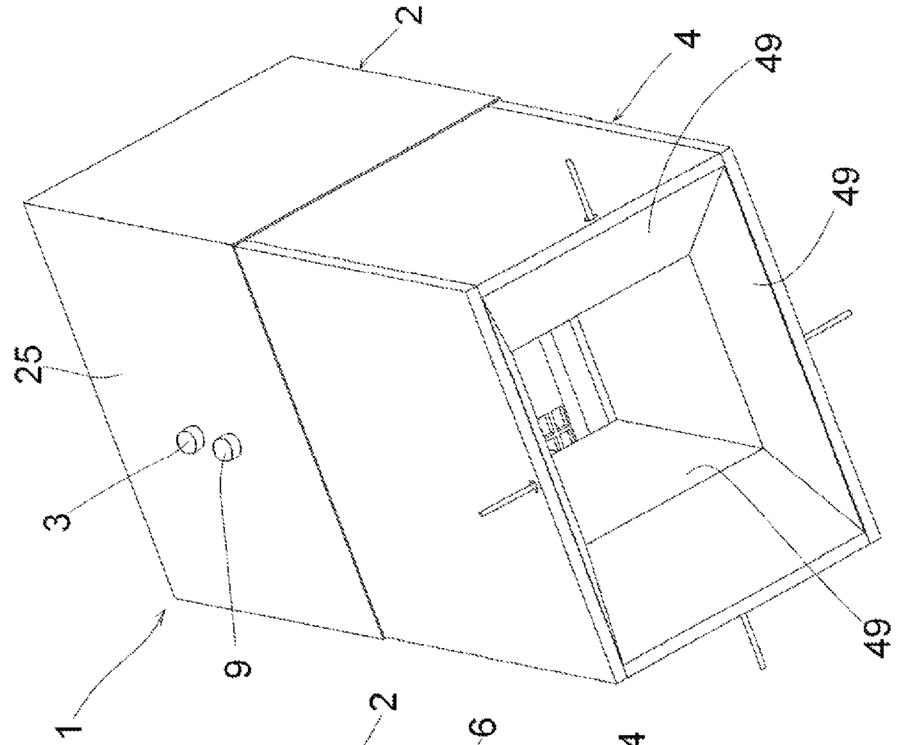
FIG. 1 is a perspective view of the hood of the invention.
Figure 2:
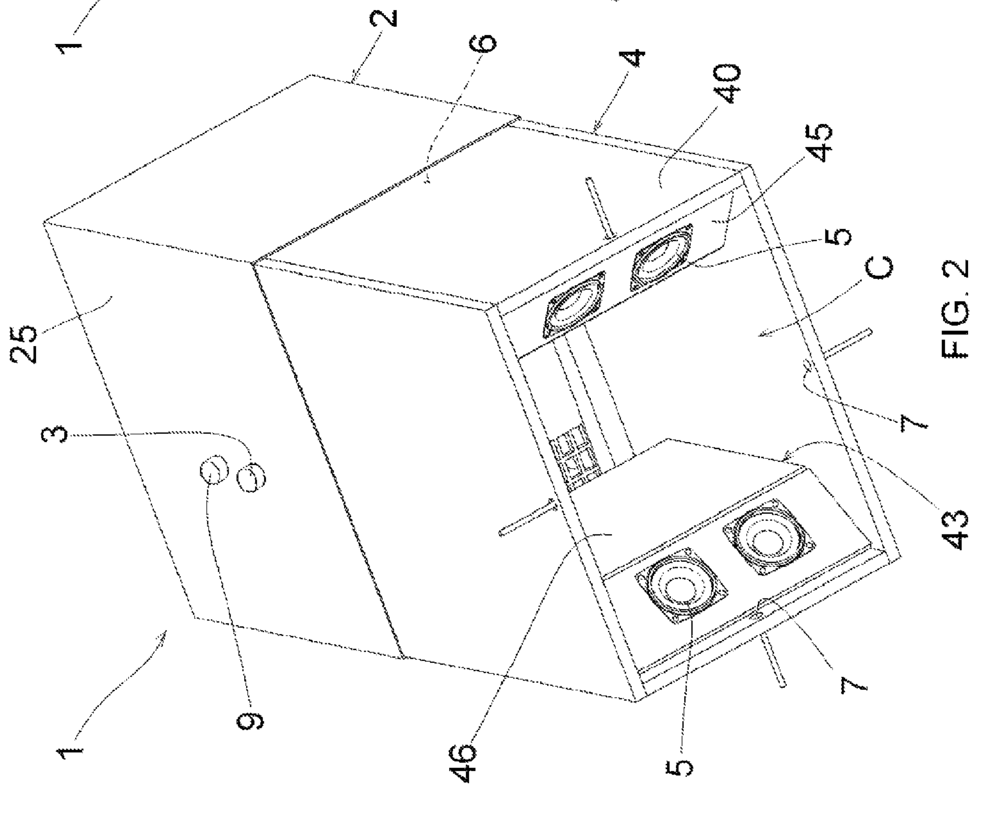
FIG. 2 is a perspective view as FIG. 1 without sound absorbent material.

Referring to the aforementioned figures, a low-noise fame extractor hood is disclosed, generally indicated with numeral (1).

The hood (1) comprises a box (2) containing an electric motor (20) that drives into rotation at least one fan (21) to extract fumes ejected from a discharge conduit (22).

For illustration purposes, the hood (1) comprises two fans (21) with horizontal axis of rotation that, by means of centrifugal force, cause extraction of fumes through lateral inlets (23) provided with grilles and discharge of fumes through the discharge conduit (22).

The box (2) of the motor-fan assembly comprises two lateral walls (24) opposite to the inlets (23) of the fans. The lateral walls (24) are made of rigid material, such as plastics or wood, and act as bearing frame. An aesthetic casing (25), generally of metal material, such as galvanized sheet steel, is disposed on lateral walls (24) in such manner to generate a substantially parallelepiped shape.

The parallelepiped structure of the aesthetic casing (25) is provided with upper opening for the discharge conduit (22) and lower opening closed by a partition plate (29) in horizontal position. The partition plate (29) is laterally provided with peripheral grilles (26) for passage of air extracted by the fans.

A box (27) with the electronic components of the hood (1) is disposed above the partition plate (29). Instead, a wedge (28) made of sound absorbent material is disposed under the partition plate (29), in such manner to direct the flow of extracted air towards the peripheral grilles (26) of the partition plate.

At least one inertial actuator/shaker (3) is disposed on the aesthetic casing (25) of the box of the motor-fan assembly. The inertial actuator/shaker (3) is known from patent application WO2011/029768, and therefore a detailed description is omitted. The base of the inertial actuator/shaker (3) is fixed to the sheet metal of the aesthetic casing (25) in order to cause vibration.

Preferably two inertial actuators/shakers (3) are used in diametrally opposite positions, respectively on the front side and back side of the aesthetic casing, in such manner that the axis joining the two shakers (3) is orthogonal to the axis of rotation of motor (20). Preferably, said inertial actuators/shakers (3) are disposed on the external surface of the aesthetic casing (25). In fact, it is to be considered that said inertial actuators/shakers have very small thickness and therefore have no aesthetic impact on the hood.

At least one accelerometer (9) is disposed on the sheet metal (25) next to said inertial actuator/shaker (3). The accelerometer (9) detects the vibrations of sheet metal (25). Shakers similar to the aforementioned ones can be used as accelerometers.

A muffler module (4) is fixed to the lower part of the box (2) of the motor-fan assembly. The muffler module (4) has a parallelepiped bearing frame, substantially similar to the one of the box (2) of the motor-fan assembly, in such manner to define an air extraction conduit (C) with vertical axis (A).

The bearing frame of the muffler module (4) comprises two lateral walls (40), a front wall (41) adapted to be faced towards the user and a back wall (42). Walls (40, 41, 42) are made of rigid material, such as plastics, sheet metal or wood and are externally covered with an aesthetic casing (not shown in the drawings), similar to the sheet casing (25) of the box of the motor-fan assembly.

Figure 3:
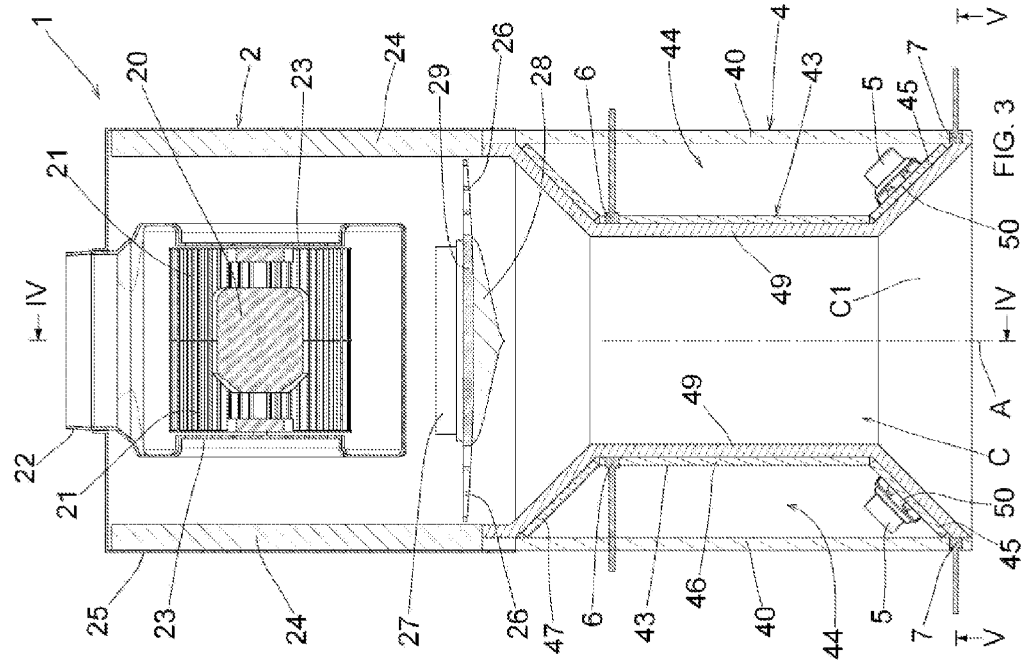
FIG. 3 is a cross-sectional view of the hood of FIG. 1.

Referring to FIG. 3, two underframes (43) are fixed to the lateral walls (40) of the bearing frame, protruding inwards in such manner to define two opposite chambers (44). Each underframe (43) comprises:

- a lower wall (45) inclined by approximately 45° with respect to the lateral wall (40),
- an intermediate wall (46) parallel to the lateral wall (40), and
- an upper wall (47) inclined by approximately 45° with respect to the lateral wall (40).

Figure 3A:
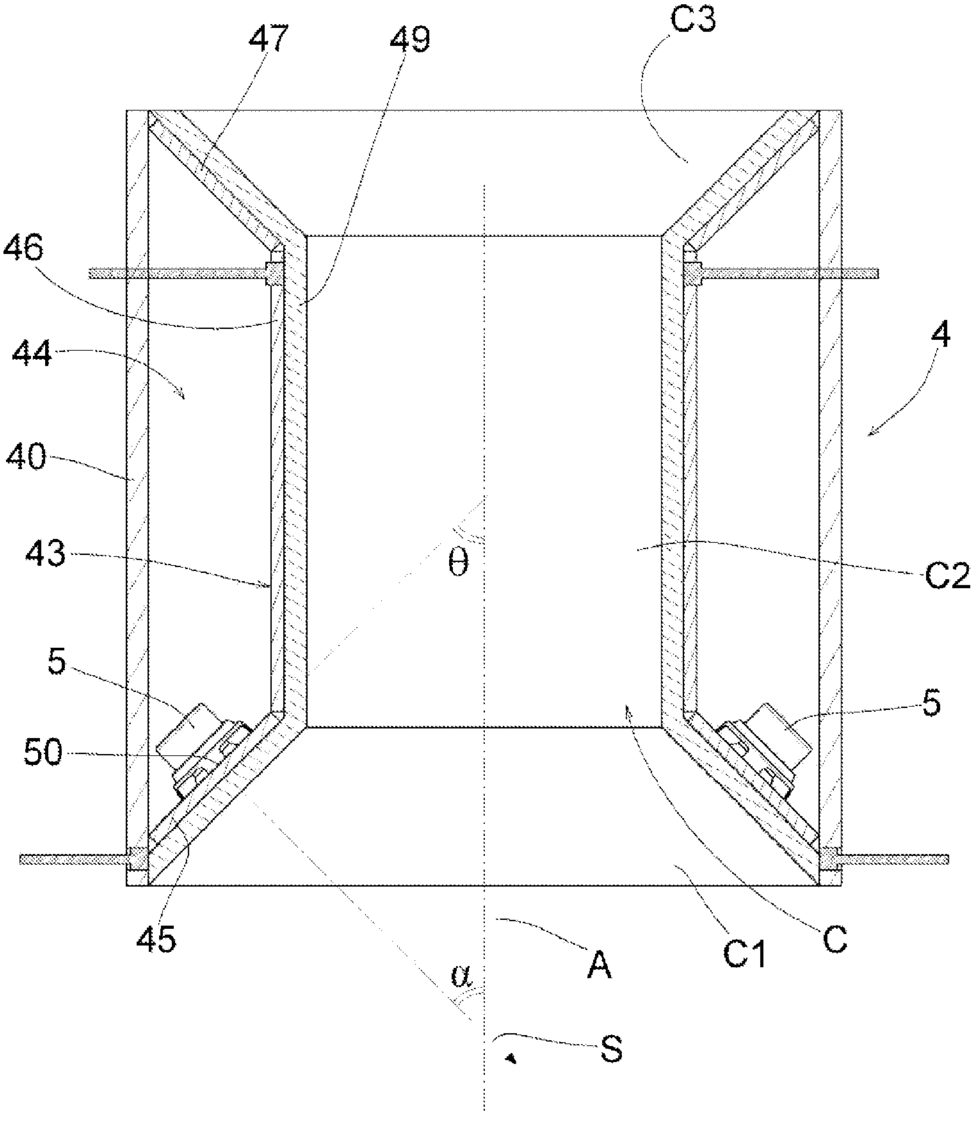
FIG. 3A is an enlarged view of the muffler module FIG. 3.

When seen in axial sectional view, the underframe (43) is substantially shaped as a trapezium, and defines a narrowing of the conduit (C) of the muffler module. Referring to FIG. 3A, the conduit (C) has a tapered inlet section (C1) with decreasing dimensions, an intermediate section (C2) with constant dimensions and a tapered outlet section (C3) with increasing dimensions. This structure of the conduit (C) favors air extraction without causing obstacles and turbulence to air flow. In particular, the tapered inlet section (C1) acts as invitation to air inlet into conduit, and the tapered outlet section (C3) acts as conveyor to convey air towards the grilles (26) of the partition wall (29) of the box of the motor-fan assembly.

At least one electro-acoustic transducer (5) is mounted on the lower wall (45) of each underframe, in such manner that the magnetic assembly of the electro-acoustic transducer (5) is contained inside the chamber (44) of the underframe. The transducer (5) has a sound emission surface (50) disposed on the lower wall (45) facing the outside of the chamber (44).

Preferably, two electro-acoustic transducers (5) are mounted in each lower wall of the underframes. In view of the above, two opposite linear arrays are defined, each array being formed of two electro-acoustic transducers.

The electro-acoustic transducer (5) is preferably a traditional loudspeaker provided with vibrating membrane with sound emission. However, the electro-acoustic transducer (5) can be a shaker that puts into vibration the lower wall (45) of the underframe in order to generate sound.

Referring to FIG. 3A, the loudspeaker (5) has a sound emission surface (50) that generates a sound beam with axis (S) orthogonal to the sound emission surface (50). The speaker (5) is arranged in such way that the sound emission surface (50) is inclined by an angle (θ) with respect to the axis (A) of conduit of the muffler module and axis (S) of sound beam is inclined by an angle (α) with respect to axis (A) of conduit of the muffler module.

Angle (θ) can vary from 0° to 90°.

By increasing the angle (θ), the possibility to change the directivity of the sound beam emitted by the loudspeakers (5) is improved, but a higher obstacle to extracted air flow is generated. By decreasing the angle (θ), the possibility to change the directivity of the sound beam decreases until limit case of θ=0°, wherein axis (S) of the sound beam of all loudspeakers is orthogonal to axis (A) of conduit. In such a case it is therefore impossible to generate a sound beam with directivity towards the outside of the conduit.

It is to be considered that loudspeakers have a specific directivity of the sound pressure level (SPL). The SPL is higher along axis (S) of the loudspeaker with respect to the one obtained when moving away from the axis (S) of the loudspeaker. For this reason, after experimental tests, the range of angle (θ) from 0 to 40° was excluded because with such an inclination of the loudspeaker, the sound pressure did not come out properly from the conduit of the hood and noise suppression did not effectively cover the acoustic field of users.

Moreover, it must be considered that the sound emission surface (50) of the loudspeaker is flush with the lower wall (45) of the frame that generates the tapered section (C1) for air inlet in the conduit of the hood. After some experimental tests, the applicant discovered that in the range of angle (θ) from 65° to 90° air impacted on the lower part (45) and on the sound emission surface (50) of loudspeakers, generating excessive capacity losses and a turbulent flow of localized air that is a source of additional noise. Consequently, also the range of angle (θ) from 65° to 90° was excluded.

According to the above considerations, the sound emission surface (50) of loudspeaker must be advantageously inclined with respect to axis (A) of the conduit by an angle (θ) comprised in the range from 40° to 65°.

An angle of approximately 45° (θ) was advantageously chosen because it is the ideal compromise between changing the directivity of the sound beam emitted by loudspeakers and avoiding obstacles for the extracted air flow.

Although the attached figures illustrate an embodiment of the present invention with two underframes (43) fixed to the lateral walls (40) of the bearing frame of the muffler module, two additional underframes can be provided and fixed to the front wall (41) and back wall (42) of the bearing frame of the muffler module, in such manner to mount additional loudspeakers in the lower walls of other underframes.

Moreover, although the attached figures illustrate a muffler module with a parallelepiped frame and rectangular cross-section, the frame can have any shape, such as for example, a pentagonal, hexagonal, circular, elliptical, etc. cross-section.

Figure 9:
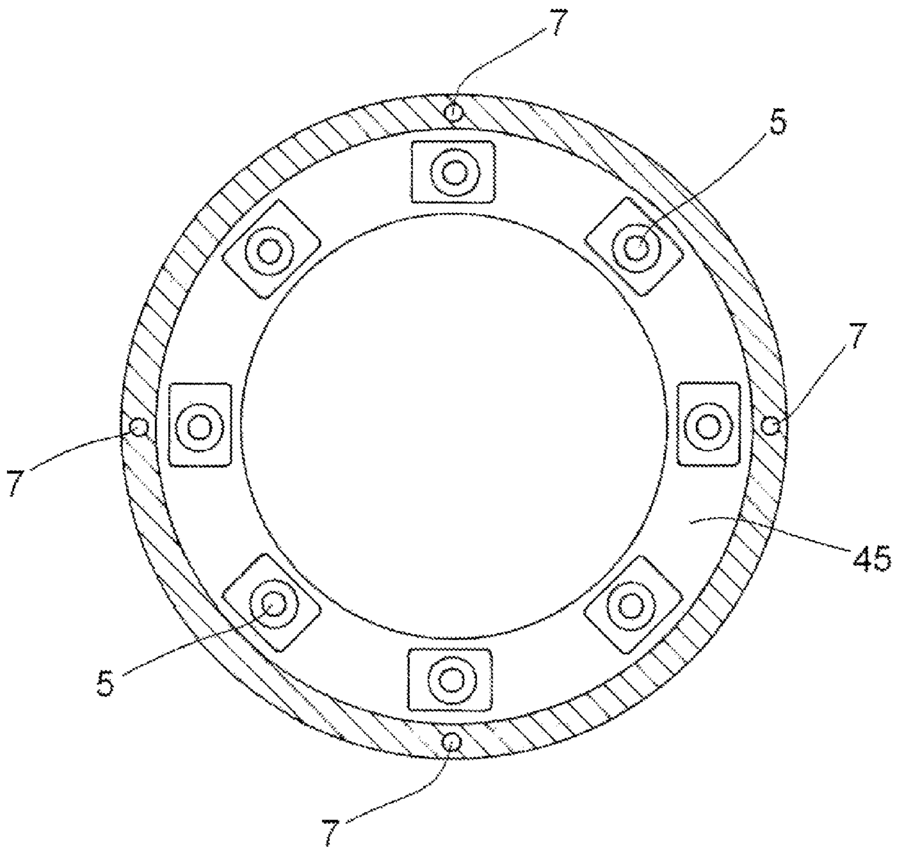
FIG. 9 is a bottom view of a second embodiment of a muffler module.

In particular, if the bearing frame has a cylindrical shape, one underframe (43) can be provided with truncated-conical lower wall (45) with decreasing diameter, cylindrical central wall (46) and truncated-conical upper wall (47) with increasing diameter. In such a case, as shown in FIG. 9, the lower wall (45) can be provided with a plurality of loudspeakers (5) disposed in circular arrangement with regular spacing angularly. Such a solution is the ideal solution to direct the sound beam in the desired direction.

Figure 4:
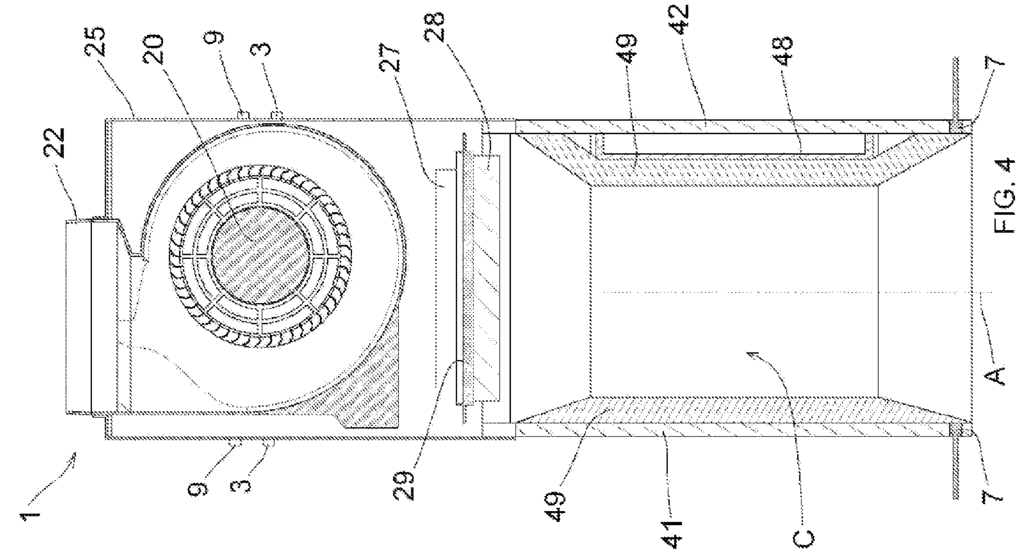
FIG. 4 is a cross-sectional view along sectional plane IV-IV of FIG. 3.

Referring to FIG. 4, the back wall (42) is provided with a box (48) facing inwards in order to contain the electronic components of the active noise suppression system. However, the box (48) can be omitted and the electronic components of the active noise suppression system can be integrated in the box (27) together with the electronic components for operation of hood.

Referring to FIG. 3, at least one picking up microphone (6) is disposed in at least one underframe (43) above the loudspeakers (5). The picking up microphone (6) is adapted to detect the noise generated by the hood. Preferably, two picking up microphones (6) are provided in diametrally opposite positions, at the upper end of the central wall (46) of the underframes.

At least one error microphone (7) is disposed under the loudspeakers (5). The error microphone is adapted to detect a noise cancellation error, in such manner to send an error signal in retraction to correct the noise cancellation made by the loudspeakers (5).

Figure 5:
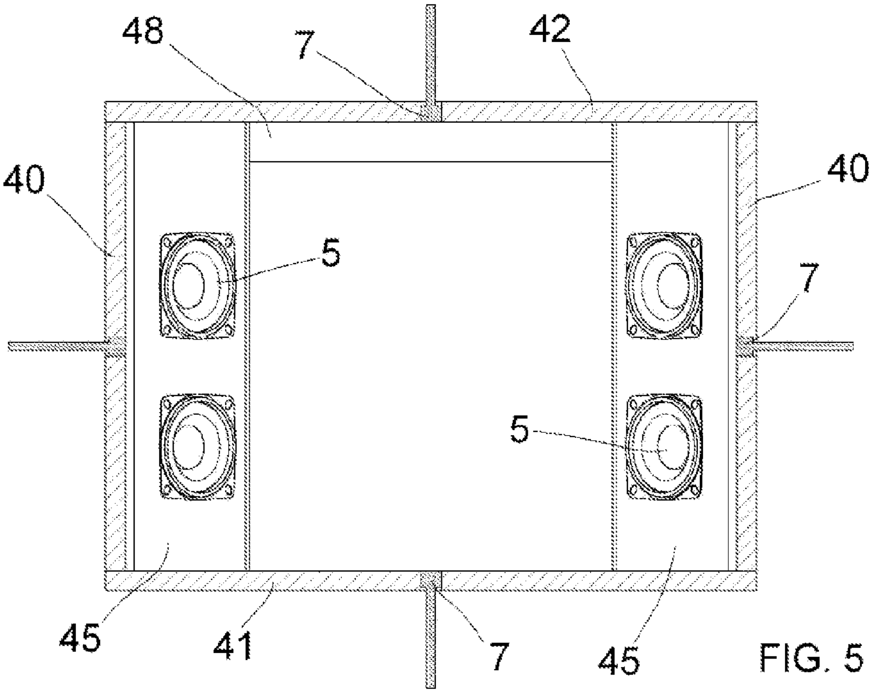
FIG. 5 is across-sectional view along sectional plane V-V of FIG. 1 without sound absorbent material.
Figure 6:
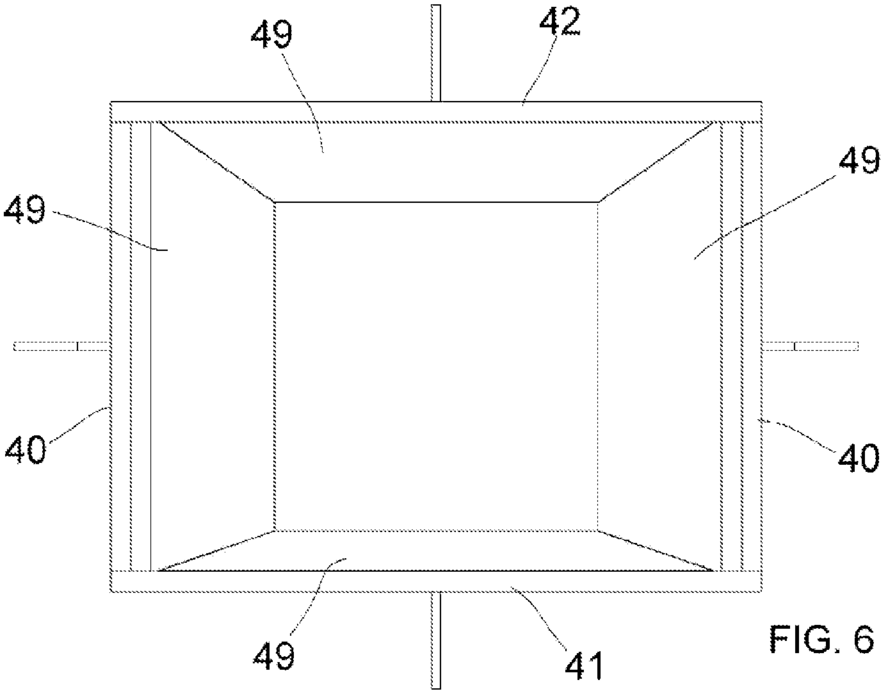
FIG. 6 is a bottom view of the hood of FIG. 1.

As shown in FIGS. 3-5, four error microphones (7) are preferably provided and disposed at the lower ends of the four walls (40, 41, 42) of the bearing frame of the muffler module, in diametrally opposite positions and regularly spaced. However, only one error microphone (7) can be provided and disposed in correspondence of the axis (A) of conduit of the noise suppression module supported by thin brackets in order not to interfere with the extracted air flow.

Sound absorbent material (49) is disposed on the internal side of the walls (40, 41, 42) of the frame of the muffler module, in such manner to cover the underframes (43) and eventually the electronics box (48). In this way, the channel (C) is surrounded by sound absorbent material (49). In particular, it is important that the sound absorbent material (49) is situated between picking up microphones (6) and error microphones (7).

Figure 7:
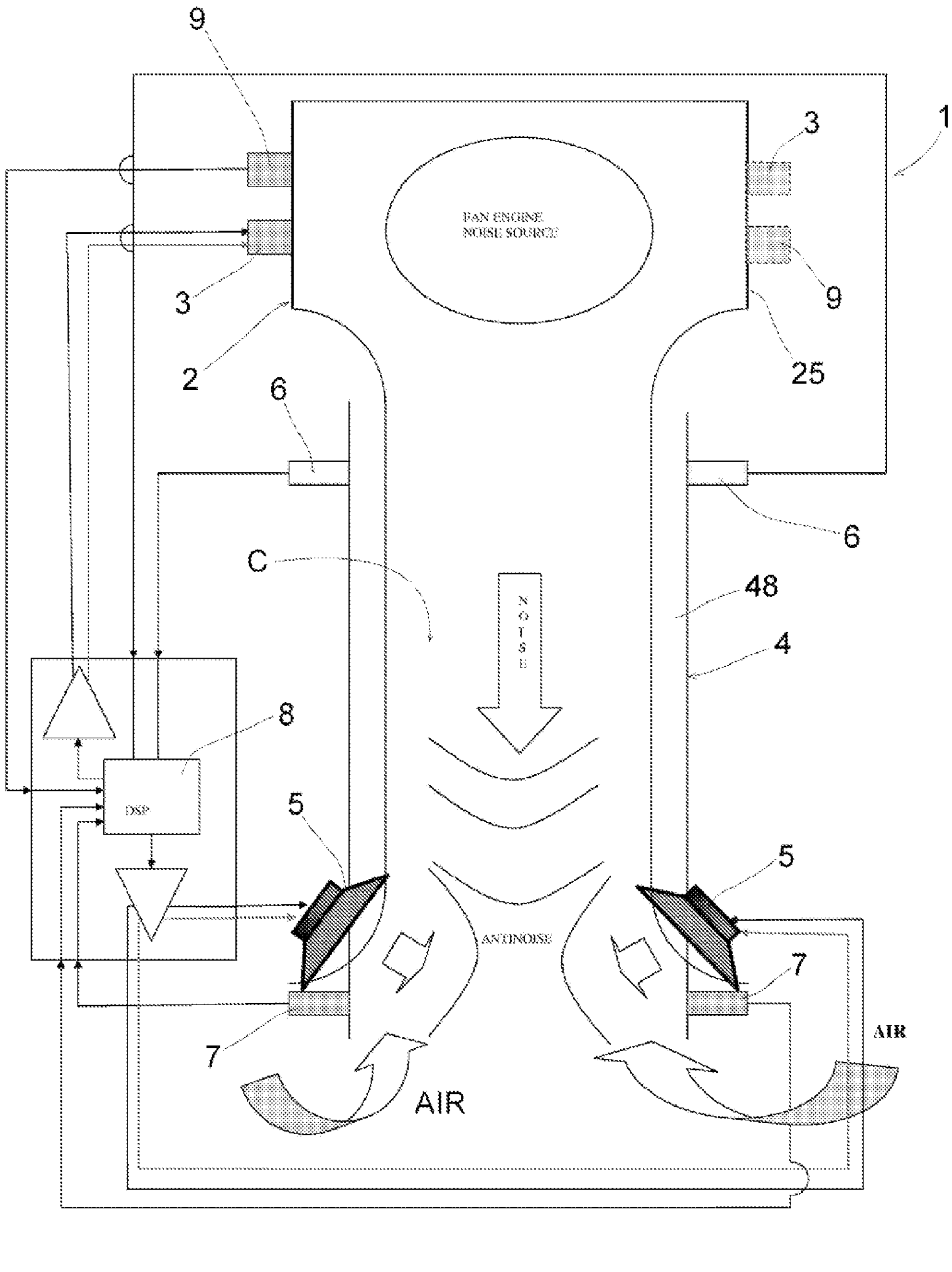
FIG. 7 is a diagrammatic view showing the operation of the active noise suppression system of the hood of the invention.
Figure 8:
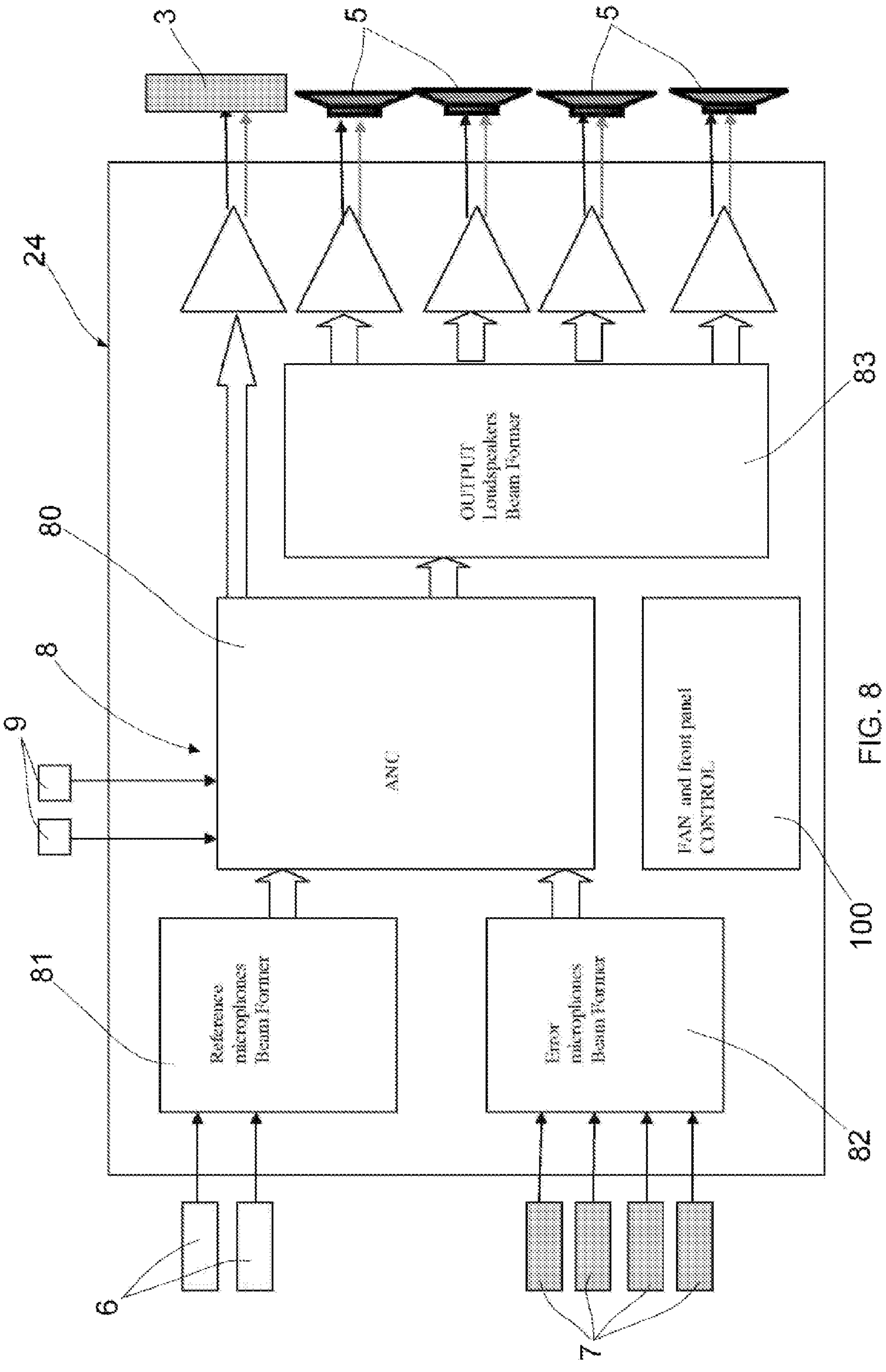
FIG. 8 is a block diagram showing the beam forming system of the hood of the invention.

FIGS. 7 and 8 show an operating diagram of the low-noise extractor hood of the invention.

The picking up microphones (6) detect the noise generated in the conduit (C) of the muffler module (4). Such noise is caused by air extraction in conduit (C), by noise of fan and motor and by vibrations of walls (25) of box with motor-fan assembly. The picking up microphones (6) send an indicative signal of the noise to a control unit (8) composed of a DSP digital signal processor.

The DSP (8) provides for an algorithm for active cancellation of the ANC noise (80) in order to control the loudspeakers (5) that emit anti-noise sound that cancels the noise generated in the hood. The DSP (8) also controls shakers (3) in such manner to make the wall (25) of the box of motor-fan assembly vibrate with vibration opposed to vibration imposed by the motor-fan assembly. Shakers (3) do not emit a sound, but attenuate vibrations on the wall (25) of the box of the motor-fan assembly.

Accelerometers (9) are connected to the DSP (8), therefore the DSP (8) controls shakers (3) in such manner to minimize acceleration of sheet metal (25) detected by accelerometers (9).

Error microphones (7) detect the noise coming out from the muffler module (4), that is the noise that was not suppressed by loudspeakers (5). Therefore, error microphones (7) send an error signal to the DSP (8), which is indicative of the noise that was not suppressed by loudspeakers.

According to the ANC algorithm (80), the DSP uses said error signal to correct the anti-noise sound emitted by the loudspeakers (5) and the attenuation of vibration of sheet metal (25) generated by shakers (3). If accelerometers (9) are provided, the ANC algorithm (80) also processes the signal received from the accelerometers (9) to control the attenuation of vibrations by shakers (3) more accurately.

The fact that the hood of the invention provides at least for two loudspeakers (5) with noise emission surface inclined by an angle (θ) lower than 90° with respect to axis (A) of conduit of the muffler module, allows for implementing a beam forming algorithm to direct the sound beam of the loudspeakers (5) towards a desired direction where noise must be suppressed. In fact, it must be considered that two sound beams generated by two loudspeakers in opposite inclined position, are combined together into a single sound beam that can be directed towards the desired direction, according to the different sound intensity of the two loudspeakers.

In such a case, as shown in FIG. 8, signals coming from picking up microphones (6) and error microphones (7) undergo beam forming algorithms (81,82) to detect the direction of the sound beam obtained from the combination of beams coming out of the four loudspeakers (5). Therefore, according to information obtained with the beam forming algorithms (81, 82) of picking up microphones and error microphones, the ANC noise suppression algorithm (80) generates a beam forming outlet (83) to direct amplifiers of loudspeakers (5) that will emit beams with different sound intensity, in such manner to generate a resulting beam directed towards the desired direction.

FIG. 8 shows the solution wherein the electronics for active noise cancellation is integrated in the same box (24) with electronics (100) for operation of the hood, viz. for operation of fan, motor and control panel of hood.

Numerous variations and modifications can be made to the present embodiments of the invention, within the reach of an expert of the field, while still falling into the scope of the invention described in the enclosed claims.

We claim:

1. A fume extractor hood comprising:

a box containing a motor-fan assembly comprising a motor that actuates at least one fan, and a muffler module disposed under said box, said muffler module comprising:

a bearing frame defining an air extractor conduit with an axis;

an active noise suppression system comprising at least two electroacoustic transducers and at least two microphones connected to a control unit; and a passive noise suppression system comprising a sound absorbent material disposed between said at least two microphones, wherein said at least two electroacoustic transducers are connected to walls of said bearing frame in opposite positions with respect the axis of said air extractor conduit in such manner to leave a central part of said air extractor conduit free, wherein each electroacoustic transducer of said at least two electroacoustic transducers having a sound emission surface inclined by an angle greater than 0° with respect to the axis of said air extractor conduit to generate sound beams with an axis inclined by an angle less than 90° with respect to the axis of said air extractor conduit in such manner that the sound beams coming from the electroacoustic transducers are mutually combined so as to obtain a resulting sound beam directed in a desired direction by a beam forming algorithm.

2. The hood of claim 1, wherein the inclination angle between said sound emission surface and the axis of said air extractor conduit is between 40° and 65°.

3. The hood of claim 1, further comprising:

at least one underframe connected to said bearing frame of said muffler module in such manner to define at least one chamber where said at least two electroacoustic transducers are mounted.

4. The hood of claim 2, wherein said underframe has a lower wall inclined by an angle greater than 0° with respect of the axis of the air extractor conduit and said at least two electroacoustic transducers are mounted with the sound emission surface disposed on said lower wall of said underframe.

5. The hood of claim 4, wherein said underframe having a central wall parallel to the axis of the air extractor conduit and an upper wall inclined with respect to the axis of the air extractor conduit in such manner to generate a tapered inlet section with decreasing dimensions, a central section with constant dimensions and a tapered outlet section with increasing dimensions.

6. The hood of claim 4, wherein said at least two electroacoustic transducers are shaker speakers and said lower wall of said underframe is a rigid plate vibrated by the shaker speakers so as to emit a noise suppression sound.

7. The hood of claim 1, wherein said at least two electroacoustic transducers are disposed in linear arrays.

8. The hood of claim 1, wherein said at least two electroacoustic transducers disposed in a circular route and equally angularly spaced.

9. The hood of claim 1, further comprising:

at least one inertial actuator/shaker connected to said control unit and arranged on one lateral wall of said box so as to attenuate a vibration of the lateral wall caused by the motor and the fan; and at least one accelerometer connected to said control unit and disposed on the lateral wall of said box next to said at least one inertial/shaker to detect an acceleration of the vibrations of said lateral wall of said box and to control said inertial actuator/shaker in accordance with the acceleration detected.

10. The hood of claim 3, further comprising:

at least two pick-up microphones disposed in diametrally opposite positions on said at least one underframe above said at least two electroacoustic transducers.

11. The hood of claim 1, further comprising:

at least four error microphones disposed on walls of said bearing frame of the muffler module under said at least two electroacoustic transducers in diametrally opposite regularly spaced positions.

12. The hood of claim 1, wherein said sound absorbent material entirely covers an internal surface of said air extractor conduit.

* * * * *